United States Patent [19]

Numai

[11] Patent Number: 4,976,513

[45] Date of Patent: Dec. 11, 1990

[54] TUNABLE WAVELENGTH FILTER

[75] Inventor: Takahiro Numai, Tokyo, Japan

[73] Assignee: NEC Corporation, Tokyo, Japan

[21] Appl. No.: 270,921

[22] Filed: Nov. 14, 1988

[30] Foreign Application Priority Data

Nov. 11, 1987 [JP] Japan .................................. 62-286136

[51] Int. Cl.[5] .............................................. G02B 5/18
[52] U.S. Cl. ................................. 350/162.11; 350/162.2
[58] Field of Search ............................. 350/96.1-96.12,
350/96.3-96.34, 311, 314, 319, 320,
162.11-162.24; 372/20, 26-28, 43-46, 32, 50,
96, 102

[56] References Cited

U.S. PATENT DOCUMENTS

| | | | |
|---|---|---|---|
| 4,704,720 | 11/1987 | Yamaguchi | 372/45 |
| 4,719,636 | 1/1988 | Yamaguchi | 372/26 |
| 4,745,616 | 5/1988 | Kaneiwa et al. | 372/45 |
| 4,751,710 | 6/1988 | Yamaguchi et al. | 372/96 |
| 4,751,719 | 6/1988 | Mito et al. | 372/26 |
| 4,796,273 | 1/1989 | Yamaguchi | 372/26 |
| 4,805,183 | 2/1989 | Kudo et al. | 372/50 |

OTHER PUBLICATIONS

S. R. Chinn and P. L. Kelley, "Analysis of the Transition, Reflection . . . Amplifiers" Optics Communications, vol. 10, No. 2, Feb. 1974, pp. 123-126.

Magari et al., "Optical Signal Selection . . . Amplifier", 1st Microoptics Conference 1987, Sponsored by the Japan Society of Applied Physics, pp. 118-121.

S. Kim & C. Fonstad, "Tunable Narrow-Band Thin-Film Waveguide Grating Filters" IEEE Jour. of Quantum Electronics, vol. QE-15, No. 12, Dec. 1979, pp. 1405-1408.

R. Alferness et al., "Narrowband Grating Resonator . . . Waveguides", Appl. Phys. Lett. 49 (3), Jul. 21, 1986, pp. 125-127.

Primary Examiner—Rodney B. Bovernick
Assistant Examiner—Thong Nguyen
Attorney, Agent, or Firm—Sughrue, Mion, Zinn, Macpeak & Seas

[57] ABSTRACT

A tunable wavelength filter comprises a plurality of distributed feedback sections and a phase-control section provided between the distributed feedback sections. The bandgap energy of the phase-control section is greater than that of the distributed feedback sections. In the tunable wavelength filter, electric current injected into the phase-control section is controlled to vary the optical length, so that light having a predetermined wavelength is transmitted through the tunable wavelength filter.

3 Claims, 2 Drawing Sheets

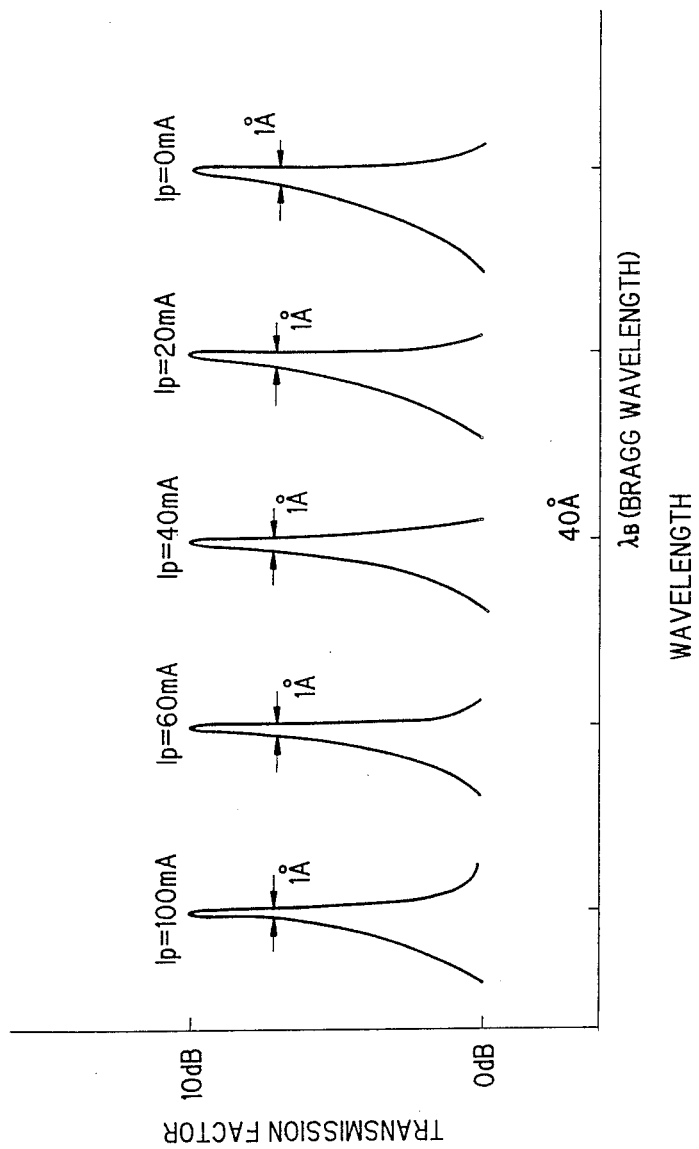

4,976,513

TUNABLE WAVELENGTH FILTER

FIELD OF THE INVENTION

The invention relates to a tunable wavelength filter applied to an optical transmission system, an optical switching, an optical information processing system and so on.

BACKGROUND OF THE INVENTION

A tunable wavelength filter has a function for selecting a predetermined wavelength light signal from wavelength multiplexing light signals, and is one of key devices which is applied to a wide use such as an optical transmission system, an optical switching, an optical information processing system and so on. In any of the uses, the tunable wavelength filter is required to have a satisfactory wavelength selectivity and a wide wavelength tuning range. Furthermore, the tunable wavelength filter is desired to be a transmission type wavelength selection filter because it must be fabricated in the form of an optical integrated circuit.

Some transmission type wavelength selection filters are studied in the past. Among them, a semiconductor wavelength tunable filter is expected to be put into a practical use because it is suitable for an optical integrated circuit. In this point, it has been proposed that a distributed feedback semiconductor laser (DFB LD) is biased below an oscillation threshold level, thereby being used as a tunable wavelength filter. It is reported that theoretical high gain and narrow transmission band width are obtained in such a wavelength tunable filter. One of such reports is described on pages 123 to 126 of "Optics Communications, February 1974, Volume 10, number 2". Furthermore, device characteristics are described on pages 118 to 121 of "Technical Digest of 1st Microoptics Conference" of "1st Microoptics Conference MOC '87 Tokyo" held on October 15 and 16 at Ishigaki Memorial Hall, Tokyo, Japan.

According to the tunable wavelength filter in which the DFB LD is biased below an oscillation threshold level, however, there is a disadvantage that an optical gain and a spontaneous emitting light intensity are varied in regard to a selected wavelength, although the selected wavelength is tuned by controlling the carrier density injected into an active layer thereof. As a result, the carrier density injected into the active layer is limited in principle to be narrow for providing an appropriate wavelength selectivity in an optical filter and a predetermined intensity ratio of light in regard to noise. Consequently, the tuning range of selection wavelength is narrow, and the number of channels is only several.

SUMMARY OF THE INVENTION

Accordingly, it is an object of the invention to provide a tunable wavelength filter having an amplification function.

It is a further object of the invention to provide a tunable wavelength filter in which the number of channels is increased.

According to the invention, a tunable wavelength filter comprises a semiconductor substrate having a common electrode on a first surface thereof, a plurality of distributed feedback sections each having a first electrode and provided on a second surface of the semiconductor substrate, and a phase-control section having a second electrode and provided on the second surface of the semiconductor substrate. In the tunable wavelength filter, the bandgap energy of the phase-control section is greater than that of said distributed feedback sections. The optical length of the phase-control section is varied by controlling electric current supplied to the second electrode.

BRIEF DESCRIPTION OF DRAWINGS

The invention will be described in more detail in conjunction with appended drawings wherein, FIG. 2 is an explanatory diagram showing a transmission property of the tunable wavelength filter in the embodiment.

DESCRIPTION OF PREFERRED EMBODIMENT

Figure 1:
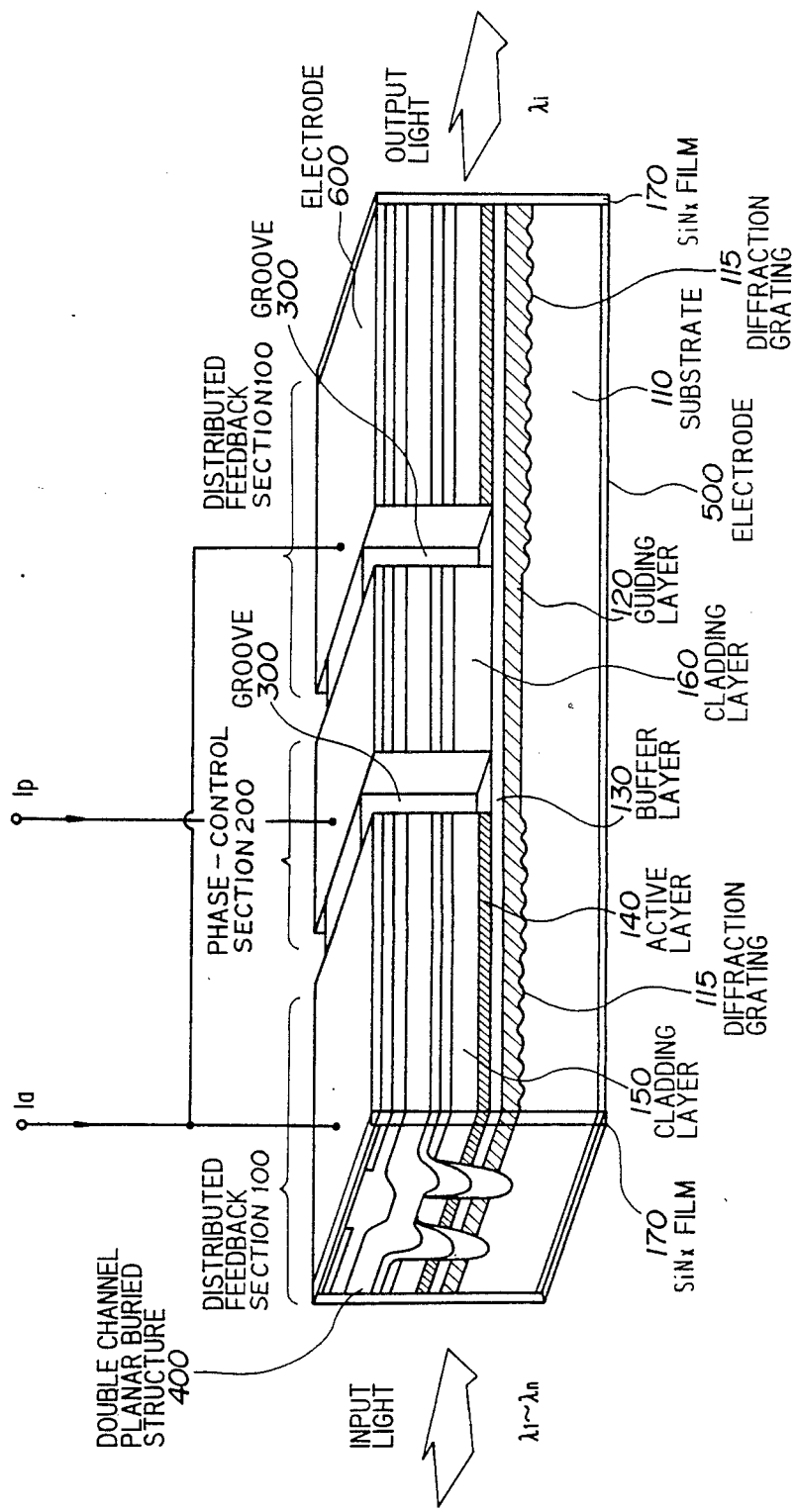
FIG. 1 is a perspective view showing a tunable wavelength filter in an embodiment according to the invention.

In FIG. 1, there is shown a tunable wavelength filter in the embodiment according to the invention. The tunable wavelength filter comprises distributed feedback sections 100 each having the length of 150 μm, a phase-control section 200 having the length of 100 μm, and grooves 300 each having the width of 20 μm and provided between the phase-control section 200 and the distributed feedback sections 100 except for central mesa portions of a double channel planar buried structure 400. The layer structure of the tunable wavelength filter comprises a substrate 110 of n-InP on which diffraction gratings 115 each having the period of 2380Å at portions corresponding to the distributed feedback sections 100, an optical guiding layer 120 of non-doped InGaAs having the bandgap wavelength of 1.3 μm and the thickness of 0.1 μm, a buffer layer 130 of n-InP having the thickness of 0.1 μm, active layers 140 provided in the distributed feedback sections 100 and each being of non-doped InGaAsP having the bandgap wavelength of 1.53 μm and the thickness of 0.1 μm, cladding layers 150 provided in the distributed feedback regions 100 and each being of p-InP, a cladding layer 160 of p-InP provided in the phase-control section 200, and the aforementioned double channel planar buried structure 400. Furthermore, an electrode 500 is provided on the back surface of the substrate 110, electrodes 600 are provided on the top surfaces of the distributed feedback and phase-control sections 100 and 200, and SiNx films 170 are provided to coat facet planes on the both sides of the tunable wavelength filter.

In accordance with the above described structure of the tunable wavelength filter, the principle in which a transmission wavelength is controlled will be explained as follows.

First of all, it is reported that a transmission wavelength of an optical waveguide including two distributed feedback sections each having a diffraction grating is determined by the optical period of the diffraction gratings and the optical phase of a phase control section between the two distributed feedback sections, for instance, as described on pages 1405 to 1408 of "IEEE Journal of Quantum Electronics, Vol. QE-15, No. 12, December 1979." In this report, a glass waveguide including a phase control section having no diffraction grating provided between two distributed feedback regions is utilized. The phase shift amount $\theta$ is defined in the equation (1).

$$\theta = 2\pi(Na - Np)Lp/\lambda \tag{1}$$

where Na is the effective refractive index in the distributed feedback sections, Np is the effective refractive index in the phase control section, Lp is the length for the phase control section, and λ is a transmission wavelength.

As understood from the equation (1), the phase shift degree θ is varied dependent on the length Lp because the effective refractive indexes Na and Np are different from each other. In other words, a transmission wavelength is varied in a stop-band dependent on the length Lp. However, a wavelength tunable filter is not realized by the glass waveguide as described in this report because the length Lp can not be varied. On the other hand, although the phase shift degree θ varies with the transmission wavelength λ, the phase shift degree θ caused by the transmission wavelength λ can be negligible because the varying amount Δλ thereof is sufficiently small as compared to the transmission wavelength λ.

Another report is described on pages 125 to 127 of "Appl. Phys. Lett. 49(3), 21 July 1986? as entitled "Narrowband grating resonator filters in InGaAsP/InP waveguides" in which a phase is shifted by π, and the experiment results and the theoretical values match well. However, even this filter does not have a function to vary the length of a phase control region.

The inventor concludes that the optical length of (Na−Np) Lp must be controlled between two distributed feedback sections, thereby realizing a tunable wavelength filter. In accordance with the concept, a tunable wavelength filter having a structure as described before is realized in the invention. In the invention, the effective refractive index Np of the phase control section 200 is varied with carriers injected thereinto to control the optical length (Na−Np)Lp. The phase-control section 200 includes a layer of a bandgap energy larger than that of input light, that is, an optical guiding layer which is transparent in regard to the input light, so that a considerable change of the refractive index is obtained in the phase-control section 200. As shown in FIG. 1, when current Ip is injected into the phase control section 200, the effective refractive index Np in the phase-control section 200 is lowered in accordance with plasma effect. Therefore, the phase shift degree θ is varied in the equation (1), so that the transmission wavelength is shifted. In this case, the variation Δλ of the transmission wavelength is small as compared to the transmission wavelength λ, so that the variation of the phase shift degree θ is negligible dependent on the variation Δλ. On the other hand, the distributed feedback sections 100 include the active layers 140, respectively, so that the optical gain is controlled with current Ia injected into the distributed feedback sections 100. Unless the active layers 140 are provided in the distributed feedback sections 100, no optical gain is obtained as a matter of course, and only a small difference of transmissivity is obtained between a resonant wavelength (a transmission peak wavelength) and an nonresonant wavelength. This means that the S/N ratio is not good in a case where wavelength multiplexing optical signals are supplied to a tunable wavelength filter, because light having wavelengths other than the resonant wavelength is transmitted through the tunable wavelength filter. For this reason, the distributed feedback sections 100 include the active layers 140. Thus, when light signals having wavelengths $\lambda_1$ to $\lambda_n$ are supplied to the tunable wavelength filter as shown in FIG. 1, a selected light signal having a wavelength $\lambda_i$ which is a resonant wavelength is supplied from the tunable wavelength filter to a following stage. In such operation, absorption loss is increased to a small extent in the phase-control section 200, and oscillation threshold value is varied therein, when carriers are injected into the phase control section 200. Therefore, carriers are controlled to be injected into the distributed feedback sections 100 separately from the phase-control section 200, so that the wavelength selection is controlled independently from the optical gain control. Although the wavelength tuning range is several Å in a tunable wavelength filter which uses a distributed feedback type semiconductor laser (DFB LD) which is biased below an oscillation threshold level thereby varying a selected wavelength and an optical gain simultaneously, it is expected in the tunable wavelength filter of the invention that a considerable number of channels are obtained for the reason why the wavelength tuning range is limited by a stop-band which is 30 to 40Å (although it changes dependent on design parameters).

Next, a process for fabricating the aforementioned wavelength tunable filter will be explained.

At first, the diffraction gratings 115 are formed on portions corresponding to the distributed feedback sections 100 of the substrate 100. Then, the optical guiding layer 120, the buffer layer 130, the active layer 140, and the cladding layer 150 are successively grown on the substrate 110 by a first liquid phase epitaxy. Thereafter, the active layer 140 and the cladding layer 150 are selectively removed from a portion corresponding to the phase-control section 200, and the cladding layer 160 is grown on the removed portion by a second liquid phase epitaxy. For the purpose of carrier confinement and transverse mode control, the double channel planar buried structure will be grown thereon. After mesa-etching, the buried epitaxy is performed by a third liquid phase epitaxy. Then, the electrodes 500 and 600 are provided on the sides of the epitaxial layers and the substrate 110, and the grooves 300 are formed for electric separations except for the central mesa portions between each of the phase-control section 200 and the distributed feedback sections 100. Finally, the SiNx films 170 are provided to coat the facet planes on the both sides of the tunable wavelength filter, thereby decreasing the reflection factor of the facet planes. The tunable wavelength filter thus fabricated has the length of 440μm in which the length of the distributed feedback sections 100 is 150μm, and that of the 10 phase-control section 200 is 100μm, as described before.

FIG. 2 shows the characteristic of the tunable wavelength filter as shown in FIG. 1 which is measured in a following method. That is, a wavelength tunable DFB LD is used for a light source from which light is emitted through a hemi-spherical ended single mode optically fiber optical-coupled to the tunable wavelength filter. At the input of the optical fiber, a polarization controller is positioned to obtain TE polarized input light, the intensity of which is −40 dBm. The two distributed feedback sections 100 are connected by lead wires through which the current Ia is injected thereinto. The transmission spectrum is measured under the situation by varying the current Ip injected into the phase-control section 200. The current Ia is set to be 0.9 times the oscillation threshold current. As the current Ip is increased, the transmission wavelength is monotonously shifted in the direction of short wavelength, so that the wavelength tuning range of 40Å is obtained under the situation that a high gain of 10 dB is maintained between the wavelength tunable filter and the optical fiber. Bandwidths at a level below the peak transmission factor by 10 dB as shown in FIG. 2 are 1Å, respectively. Each of the bandwidths is maintained to be 1Å during operation in which a selected wavelength is varied. Where cross-talk of −10 dB is allowed for a tolerance, the tunable wavelength filter can be applied to an optical filter for 80 channels.

Material and composition in the embodiment may be replaced by other semiconductor material such as, for instance, GaAs system material, or dielectric material such as, for instance, $TiO_2$, $Al_2O_3$ etc. Furthermore, the optical waveguide structure is not limited to planar structure or buried structure.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A tunable wavelength filter, comprising:
    a semiconductor substrate having a first electrode provided on a first surface thereof;
    first and second distributed feedback sections provided on a second surface of said semiconductor substrate; and
    a phase-control section provided on said second surface of said semiconductor substrate to be positioned between said first and second distributed feedback sections, each of said first and second distributed feedback sections and said phase-control section having a second electrode provided on respective surfaces thereof opposite to said semiconductor substrate;
    wherein said phase-control section is optically coupled to said first and second distributed feedback sections, and a bandgap energy of said phase-control section is greater than that of said first and second distributed feedback sections.

2. A tunable wavelength filter, according to claim 1, further comprising:
    first and second films provided on facet planes of said first and second distributed feedback sections opposite to said phase-control section for decreasing reflectivity of said facet planes.

3. A tunable wavelength filter, according to claim 2, wherein:
    each of said first and second distributed feedback sections comprises:
    a diffraction grating of a uniform period provided on said second surface of said semiconductor substrate at portions of said second surface corresponding to said first and second distributed feedback sections;
    an optical guiding layer and a buffer layer successively grown on said diffraction grating;
    an active layer and a cladding layer successively grown on said buffer layer;
    a double channel planar structure grown on said cladding layer; and
    wherein said phase-control section comprises:
    an optical guiding layer and a buffer layer, provided on said second surface of said semiconductor substrate, which are integral with said optical distributed feedback sections;
    a cladding layer having no active layer grown on said buffer layer; and
    a double channel planar buried structure grown on said cladding layer.

* * * * *

UNITED STATES PATENT AND TRADEMARK OFFICE
CERTIFICATE OF CORRECTION

PATENT NO. : 4,976,513

DATED : December 11, 1990

INVENTOR(S) : Takahiro Numai

It is certified that error appears in the above-identified patent and that said Letters Patent is hereby corrected as shown below:

Column 3, line 21, delete "1986?", and insert --1986"--.

Column 4, line 48, delete "10".

Signed and Sealed this

Nineteenth Day of May, 1992

Attest:

DOUGLAS B. COMER

*Attesting Officer*    *Acting Commissioner of Patents and Trademarks*